United States Patent
Shimizu

(10) Patent No.: US 9,721,633 B2
(45) Date of Patent: Aug. 1, 2017

(54) SEMICONDUCTOR MEMORY DEVICE WITH ADDRESS LATCH CIRCUIT

(71) Applicant: Naoki Shimizu, Seoul (KR)

(72) Inventor: Naoki Shimizu, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 119 days.

(21) Appl. No.: 14/201,635

(22) Filed: Mar. 7, 2014

(65) Prior Publication Data

US 2015/0063016 A1 Mar. 5, 2015

Related U.S. Application Data

(60) Provisional application No. 61/872,301, filed on Aug. 30, 2013.

(51) Int. Cl.
*G11C 11/16* (2006.01)

(52) U.S. Cl.
CPC ...... *G11C 11/1653* (2013.01); *G11C 11/1657* (2013.01)

(58) Field of Classification Search
CPC ............ G11C 11/1653; G11C 11/1655; G11C 11/1657; G11C 8/08
See application file for complete search history.

(56) References Cited

U.S. PATENT DOCUMENTS

| | | | |
|---|---|---|---|
| 6,067,255 A | 5/2000 | Jung et al. | |
| 6,292,428 B1 | 9/2001 | Tomita et al. | |
| 7,764,551 B2 * | 7/2010 | Seo | G06F 13/4234 365/185.08 |
| 8,184,487 B2 * | 5/2012 | Mirichigni | G06F 12/00 365/189.011 |
| 2003/0088753 A1 | 5/2003 | Ikeda et al. | |
| 2007/0109884 A1 | 5/2007 | Jung | |
| 2008/0291727 A1 | 11/2008 | Seo et al. | |
| 2009/0097329 A1 | 4/2009 | Yoko | |
| 2009/0122619 A1 | 5/2009 | Sartore et al. | |

(Continued)

FOREIGN PATENT DOCUMENTS

| | | |
|---|---|---|
| JP | 07334996 A | 12/1995 |
| JP | 2012-022726 A | 2/2012 |

(Continued)

OTHER PUBLICATIONS

JEDEC Standard, DDR SDRAM Specification, JESD79C, Mar. 2003, pp. 1-75.*

(Continued)

*Primary Examiner* — Harry W Byrne
*Assistant Examiner* — R Lance Reidlinger
(74) *Attorney, Agent, or Firm* — Holtz, Holtz & Volek PC

(57) ABSTRACT

A semiconductor memory device includes: banks each including a memory cell array; word lines connected to rows in each of the banks; and an address latch circuit configured to latch a full address specifying one of the word lines, the full address including a first address and a second address. The address latch circuit receives a first command and a second command to latch the first address and the second address in accordance with the first command and the second command, respectively. Paths for the first address and the second address are configured to be separate from each other.

16 Claims, 11 Drawing Sheets

| | CLK | CA0 | CA1 | CA2 | CA3 | CA4 | CA5 | CA6 | CA7 | CA8 | CA9 |
|---|---|---|---|---|---|---|---|---|---|---|---|
| Active | ↑ | L | H | R8 | R9 | R10 | R11 | R12 | BA0 | BA1 | BA2 |
| | ↓ | R0 | R1 | R2 | R3 | R4 | R5 | R6 | R7 | R13 | X |

| | CLK | CA0 | CA1 | CA2 | CA3 | CA4 | CA5 | CA6 | CA7 | CA8 | CA9 |
|---|---|---|---|---|---|---|---|---|---|---|---|
| Read/write | ↑ | H | L | L/H | RFU | RFU | C1 | C2 | BA0 | BA1 | BA2 |
| | ↓ | AP | C3 | C4 | C5 | C6 | C7 | R14 | R15 | R16 | R17 ⟵ For postactive |

(56) References Cited

U.S. PATENT DOCUMENTS

2012/0051150 A1    3/2012  Mirichigni et al.
2012/0281460 A1*  11/2012  Abraham ................. G11B 5/02
                                                    365/158

FOREIGN PATENT DOCUMENTS

| JP | 2012-203938 A | 10/2012 |
| RU | 2405221 C2 | 11/2010 |
| WO | 2010062309 A1 | 6/2010 |

OTHER PUBLICATIONS

Reinhardt, Steven K., EECS 373 F99 Notes, pp. 9-1 to 9-4, 1999.*
International Search Report (ISR) including Written Opinion dated Oct. 14, 2014, issued in parent International Application No. PCT/JP2014/070415.
Taiwanese Office Action (and English translation thereof) dated Jan. 13, 2016, issued in counterpart Taiwanese Application No. 103129987.
JEDEC Standard, Double Data Rate (DDR) SDRAM Specification, JESD79C, Mar. 2003.
Taiwanese Office Action (and English translation thereof) dated May 18, 2016, issued in counterpart Taiwanese Application No. 103129987.
Russian Office Action dated May 4, 2017 issued in counterpart Russian Application No. 2016107387.

* cited by examiner

| | CLK | CA0 | CA1 | CA2 | CA3 | CA4 | CA5 | CA6 | CA7 | CA8 | CA9 |
|---|---|---|---|---|---|---|---|---|---|---|---|
| Active | ↑ | L | H | R8 | R9 | R10 | R11 | R12 | BA0 | BA1 | BA2 |
| | ↓ | R0 | R1 | R2 | R3 | R4 | R5 | R6 | R7 | R13 | X |

FIG. 4

| | CLK | CA0 | CA1 | CA2 | CA3 | CA4 | CA5 | CA6 | CA7 | CA8 | CA9 |
|---|---|---|---|---|---|---|---|---|---|---|---|
| Read/write | ↑ | H | L | L/H | RFU | RFU | C1 | C2 | BA0 | BA1 | BA2 |
| | ↓ | AP | C3 | C4 | C5 | C6 | C7 | R14 | R15 | R16 | R17 |

For postactive

FIG. 5

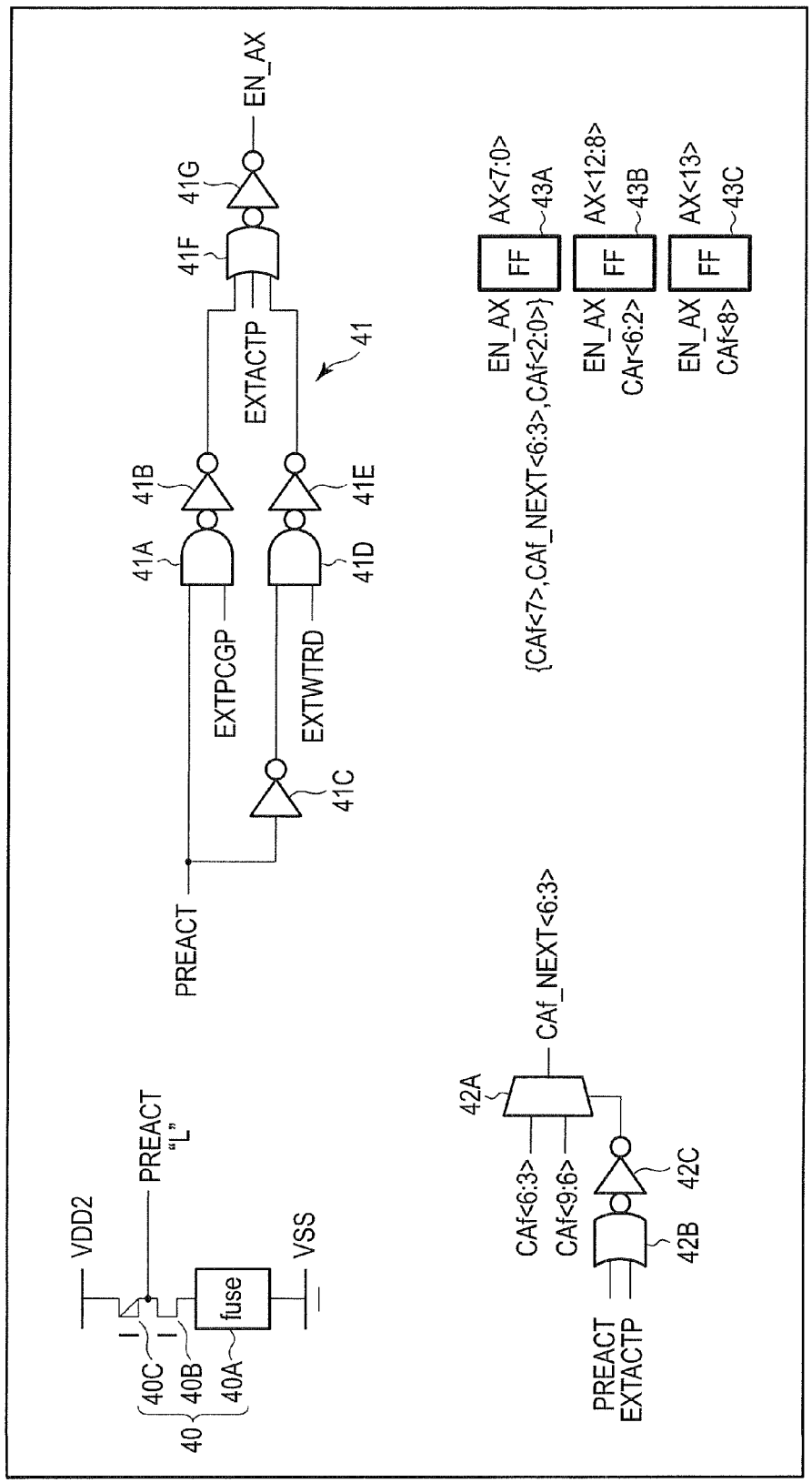
F I G. 7

| | CLK | CA0 | CA1 | CA2 | CA3 | CA4 | CA5 | CA6 | CA7 | CA8 | CA9 |
|---|---|---|---|---|---|---|---|---|---|---|---|
| Precharge | ↑ | H | H | L | H | AB | X | X | BA0 | BA1 | BA2 |
| | ↓ | X | X | X | R14 | R15 | R16 | R17 | BA0 | BA1 | BA2 |

CA9 BA2 columns annotated: "For precharge", "For preactive"

FIG. 10

| | CLK | CA0 | CA1 | CA2 | CA3 | CA4 | CA5 | CA6 | CA7 | CA8 | CA9 |
|---|---|---|---|---|---|---|---|---|---|---|---|
| Active | ↑ | L | H | R8 | R9 | R10 | R11 | R12 | BA0 | BA1 | BA2 |
| | ↓ | R0 | R1 | R2 | R3 | R4 | R5 | R6 | R7 | R13 | X |

FIG. 11

SEMICONDUCTOR MEMORY DEVICE WITH ADDRESS LATCH CIRCUIT

CROSS-REFERENCE TO RELATED APPLICATIONS

This application claims the benefit of U.S. Provisional Application No. 61/872,301, filed Aug. 30, 2013, the entire contents of which are incorporated herein by reference.

FIELD

Embodiments described herein relate generally to a semiconductor memory device.

BACKGROUND

An MRAM (Magnetic Random Access Memory) is a memory device using a magnetic element having a magnetoresistive effect as a memory cell for storing information, and is attracting attention as a next generation nonvolatile memory device capable of a high speed operation and having a large capacity. Also, the MRAM has been researched and developed as a memory to replace a volatile memory such as a DRAM or SRAM. In this case, it is desirable to operate the MRAM by using the same specifications as those of the DRAM or SRAM, in order to reduce the development cost and make the replacement smooth.

BRIEF DESCRIPTION OF THE DRAWINGS

FIG. 4 is a diagram illustrating command/address assignment for an active command;
FIG. 5 is a diagram illustrating command/address assignment for a read/write command;
FIG. 7 is a diagram illustrating an operation according to the comparative example;
FIG. 10 is a diagram illustrating command/address assignment for a precharge command;
FIG. 11 is a diagram illustrating command/address assignment for an active command.

DETAILED DESCRIPTION

Figure 1:
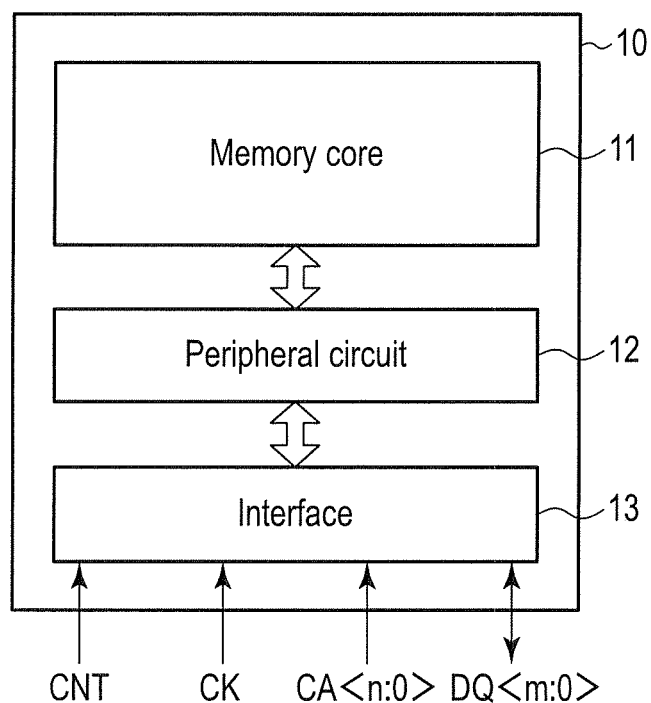
FIG. 1 is a schematic diagram of a semiconductor memory device according to a first embodiment.

In general, according to one embodiment, there is provided a semiconductor memory device comprising:
banks each including a memory cell array;
word lines connected to rows in each of the banks; and
an address latch circuit configured to latch a full address specifying one of the word lines, the full address including a first address and a second address,
wherein the address latch circuit receives a first command and a second command to latch the first address and the second address in accordance with the first command and the second command, respectively, and
paths for the first address and the second address are configured to be separate from each other.

Embodiments of the present invention will be described below with reference to the drawings. In the description below, elements with the same functions and configurations are denoted by the same reference numerals, and duplicate descriptions are provided only when needed.

The embodiments will be described taking an MRAM (Magnetic Random Access Memory) as an example of a semiconductor memory device.

First Embodiment

FIG. 1 is a schematic diagram of a semiconductor memory device 10 according to a first embodiment. The semiconductor memory device 10 comprises a memory core 11, a peripheral circuit 12, and an interface 13.

The memory core comprises a plurality of memory cells storing data. The peripheral circuit 12 writes and reads data to and from the memory core 11.

The interface 13 receives, from an external device (host), a control signal CNT for read and write and a clock signal CK that controls the operational timing for read and write. The interface 13 is also connected to the host by a command/address line CA<n:0> and a data line DQ<m:0>, where n and m are natural numbers.

The control signal CNT includes a clock enable signal CKE and a chip select signal CS. The clock CK is used to control the operational timing for the semiconductor memory device 10. The command/address line CA<n:0> is used to transmit and receive commands and addresses. The data line DQ<m:0> is used to transmit and receive input data and output data.

Figure 2:
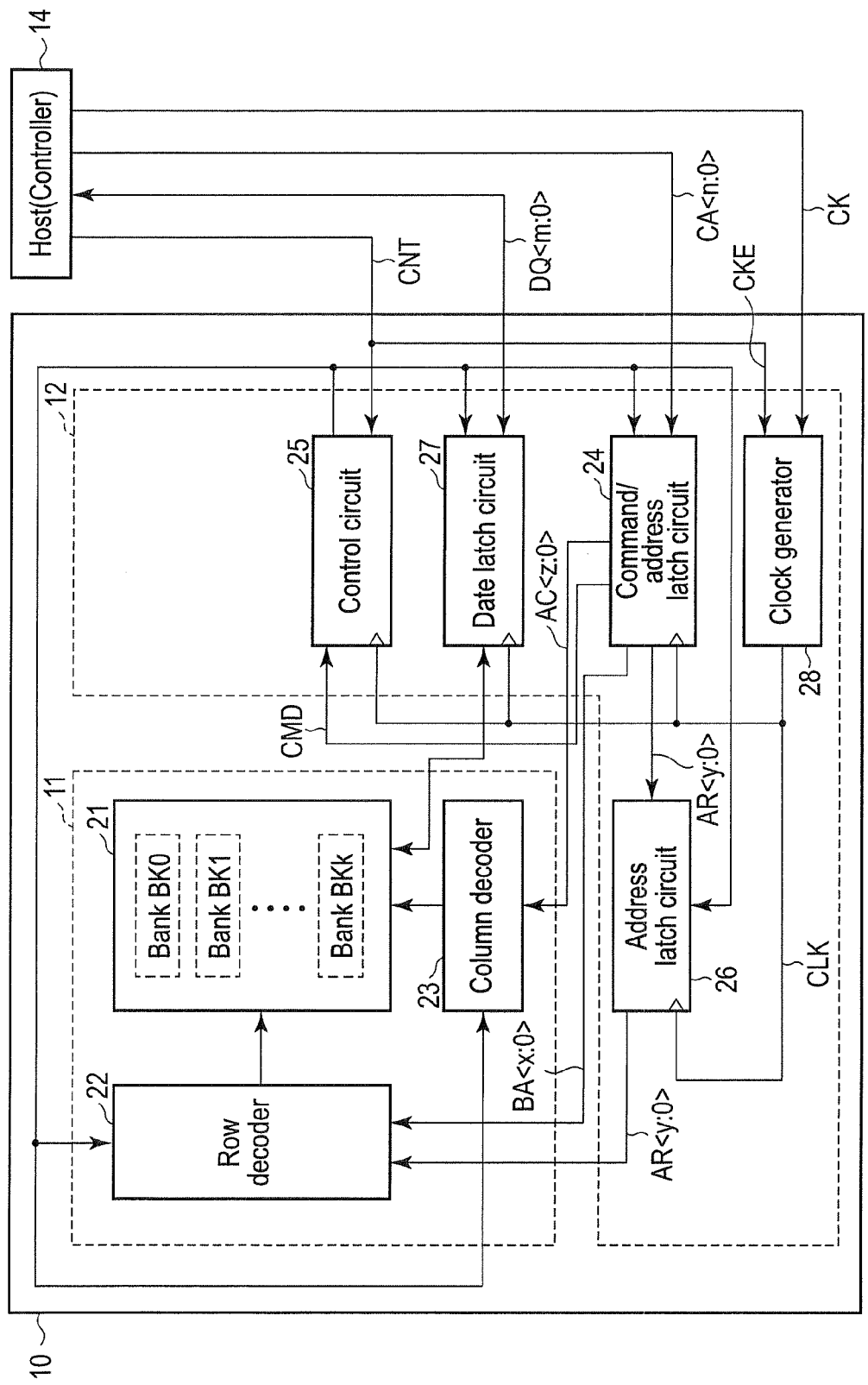
FIG. 2 is a block diagram showing an example of a memory core and a peripheral circuit.

FIG. 2 is a block diagram showing an example of the memory core 11 and the peripheral circuit 12. The memory core 11 comprises a memory cell array unit 21, a row decoder 22, and a column decoder 23. The memory cell array unit 21 comprises (k+1) banks BK0 to BKk, where k is a natural number. The banks BK0 to BKk can be independently activated. For example, power consumption can be reduced by activating only the needed bank during read or write.

The row decoder 22 decodes, for example, a bank address BA<x:0> that selects one of the banks BK0 to BKk and a row address AR<y:0> that selects from rows in the bank.

The column decoder 23 decodes, for example, a column address AC<z:0> that selects from columns in the memory cell array unit 21.

The peripheral circuit 12 comprises a command/address latch circuit 24, a control circuit 25, an address latch circuit 26, a data latch circuit 27, and a clock generator 28.

The command/address latch circuit 24 receives a command CMD and an address ADD from a host 14 via the command/address line CA<n:0>, and temporarily stores the command CMD and the address ADD. The command CMD is sent to the control circuit 25. The control circuit 25 controls the internal operation of the semiconductor memory device 10.

The bank address BA<x:0>, the row address AR<y:0>, and the column address AC<z:0>, which are included in the address ADD, are sent to the row decoder 22, the address latch circuit 26, and the column decoder 23, respectively.

According to the present embodiment, as described below, when an active command is input, a part of the full row address is latched in the address latch circuit 26, whereas another part of the full row address is latched in the address latch circuit 26 when the read/write command, which is input after the input of the active command, is input.

When the full row address is thus divided into the two parts corresponding to the two respective commands so that the two parts are separately input, the semiconductor memory device can be incorporated into the system without an increase in the number of pins or a decrease in operating speed even with an increased number of bits in a row address for selecting from word lines (rows) in the memory array unit 21.

A precharge command is a command for setting a selected bank to an initial state (precharge state) for a read operation or a write operation. Specifically, the precharge command inactivates all word lines, all bit lines, and all source lines. The active command is a command for carrying out a process of activating one of the plurality of word lines in the selected bank to read data from memory cell arrays.

The data latch circuit 27 temporarily stores input data received from the host 14 via the data line DQ<m:0> or output data read from a selected bank. The input data is written to the selected bank.

The clock generator 28 generates an internal clock CLK based on the clock CK from the host 14. The internal clock CLK is input to the command/address latch circuit 24, the control circuit 25, the address latch circuit 26, and the data latch circuit 27 and used to control the operational timing for these circuits 24, 25, 26, and 27.

Figure 3:
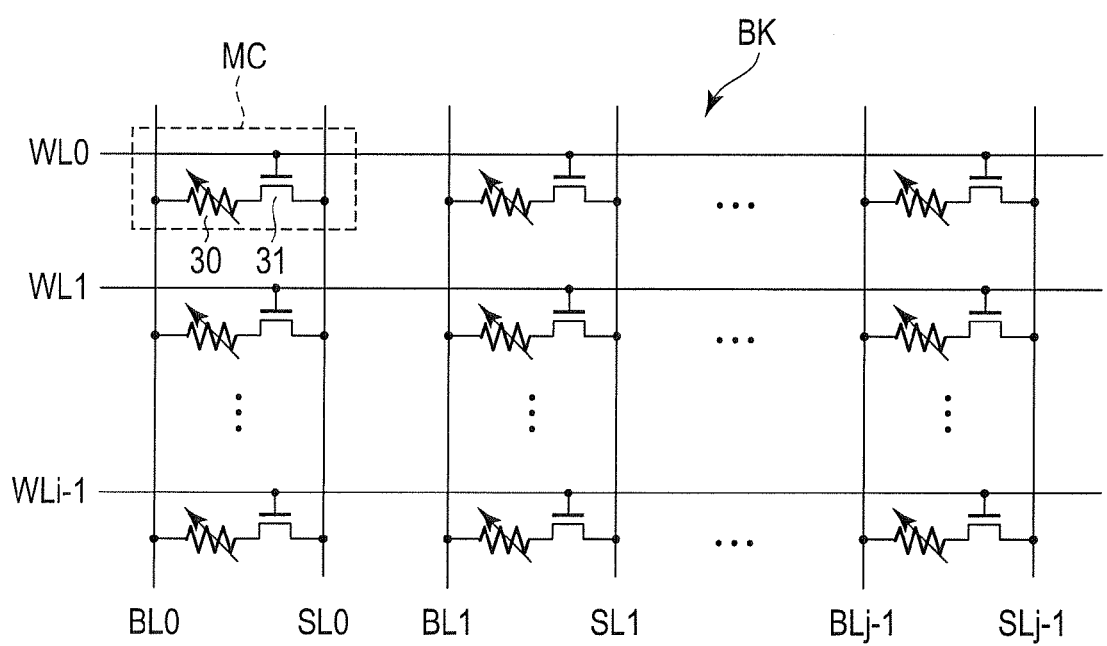
FIG. 3 is a circuit diagram of memory cell arrays included in one bank.

FIG. 3 is a circuit diagram of memory cell arrays included in one bank. The memory cell arrays comprise a plurality of memory cells MC arranged in a matrix. A plurality of word lines WL0 to WLi−1, a plurality of bit lines BL0 to BLj−1, and a plurality of source lines SL0 to SLj−1 are disposed on the memory cell arrays. One row of a memory cell array is connected to one word line WL. One column of a memory cell array is connected to a pair of one bit line BL and one source line SL.

The memory cell MC comprises a magnetoresistive element (MTJ (Magnetic Tunnel Junction) element) 30 and a select transistor 31. The select transistor 31 comprises, for example, an N-channel MOSFET.

One end of the MTJ element 30 is connected to the bit line BL. The other end of the MTJ element 30 is connected to a drain of the select transistor 31. A gate of the select transistor 31 is connected to the word line WL. A source of the select transistor 31 is connected to the source line SL.

<Command/Address Assignment>

Now, command/address assignment will be described. FIG. 4 is a diagram illustrating command/address assignment for the active command. FIG. 5 is a diagram illustrating command/address assignment for the read/write command.

In FIG. 4 and FIG. 5, arrows for the clock CLK are indicative of a rising edge and a falling edge of the clock. CA0 to CA9 denote commands and addresses input through command/address pads (command/address lines). The number of command/address pads is illustrative, and the first embodiment is not limited to this value. A bank address BA specifying a bank comprises, for example, 3 bits (BA0 to BA2). A row address R comprises, for example, 18 bits (R0 to R17). A first row address (a part of a full row address) included in the bits R0 to R17 of the full row address and input along with the active command comprises, for example, lower bits R0 to R13. A second row address (another part of the full row address) included in the bits R0 to R17 of the full row address and input along with the read/write command comprises, for example, upper bits R14 to R17. A column address C comprises, for example, 7 bits (C1 to C7).

In FIG. 4, an active operation is specified at the rising edge and falling edge of the clock CLK when the active command is input. The active command is defined using CA0=L and CA1=H, at the rising edge of the clock CLK when a chip select signal CS is asserted. At the rising edge of the clock CLK, the row addresses R8 to R12 is received through the pads CA2 to CA6, and the bank addresses BA0 to BA2 is received through the pads CA7 to CA9. At the falling edge of the clock CLK, the row addresses R0 to R7 and R13 is received through the pads CA0 to CA8. "X" means don't care.

In FIG. 5, a read/write operation is specified at the rising edge of the clock CLK when the read/write command is input. At the falling edge of the clock CLK, a postactive operation is specified. That is, the read/write command can set the read/write operation and the postactive operation. The read command is defined using CA0=H, CA1=L, and CA2=L at the rising edge of the clock CLK when the chip select signal CS is asserted. The write command is defined using CA0=H, CA1=L, and CA2=H at the rising edge of the clock CLK when the chip select signal CS is asserted.

In the read/write operation, the column addresses C1 and C2 is received through the pads CA5 and CA6. The bank addresses BA0 to BA2 is received through the pads CA7 to CA9.

In the postactive operation, the column addresses C3 to C7 is received through the pads CA1 to CA7. The upper row addresses R14 to R17 are received through the pads CA6 to CA9. In FIG. 5, "RFU" means reserved for future use, and "AP" is a flag that defines auto-precharge.

Comparative Example

Figure 6:
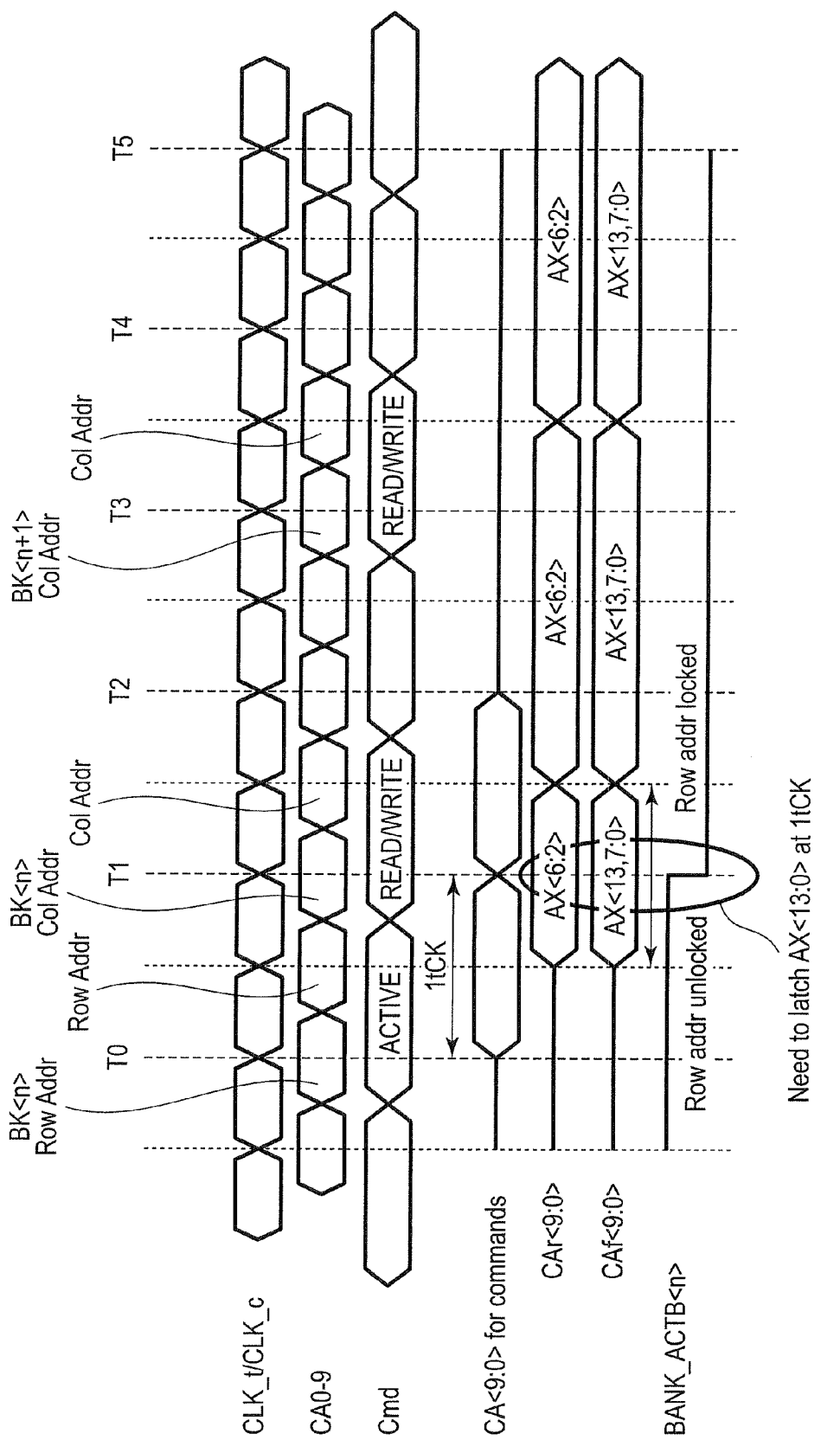
FIG. 6 is a timing chart according to a comparative example.

Now, an operation according to a comparative example will be described. FIG. 6 is a timing chart according to the comparative example. In FIG. 6, clocks CLK_t and CLK_c are complementary clocks. A signal CAr is a signal on the pad CA at the rising edge of the clock. A signal CAf is a signal on the pad CA at the falling edge of the clock. A signal BANK_ACTB<n> is generated using the active command and the bank addresses BA0 to BA2. A signal BANK_ACTB<n> indicates that a low level has been asserted.

The active command is input to a bank BK<n> to specify an active operation. In the active operation, the row addresses R8 to R12 is set at the rising edge of the clock, and the row addresses R0 to R7 and R13 is set at the falling edge of the clock.

Subsequently, one clock cycle (1tCK) after the active command, the read/write command is input to the bank BK<n> to specify a read/write operation and a postactive operation. For the read/write operation and the postactive operation, the column addresses C1 to C7 and the row addresses R14 to R17 are set.

FIG. 7 is a diagram illustrating an operation according to the comparative example.

A setting circuit 40 is a circuit for setting either the postactive operation or a preactive operation. The setting circuit 40 comprises a fuse 40A, an n-channel MOSFET 40E, and a p-channel MOSFET 40c which are connected together in series. One end of the fuse 40A is connected to a power supply VSS. One end of the p-channel MOSFET 40c is connected to a power supply VDD2. The setting circuit 40 outputs a signal PREACT at the low level when the semiconductor memory device 10 is set for the postactive operation. The setting circuit 40 outputs the signal PREACT at a high level when the semiconductor memory device 10 is set for the preactive operation. According to the first embodiment, the signal PREACT=L. The state of the signal PREACT can be set by programming the fuse 40A.

The signal generation circuit 41 receives the signal PREACT, a signal EXTPCGP, a signal EXTWTRD, and a signal EXTACTP to generate an enable signal EN_AX for flip flops described below. The signal EXTPCGP is asserted when the precharge command is input to the signal generation circuit 41. The signal EXTWTRD is asserted when the read/write command is input to the signal generation circuit 41. The signal EXTACTP is asserted when the active command is input to the signal generation circuit 41.

The signal PREACT and the signal EXTPCGP are input to a NAND gate 41A. An output from the NAND gate 41A is input to a NOR gate 41F via an inverter circuit 41B. The signal PREACT is input to an inverter circuit 41C. An output from the inverter circuit 41C and the signal EXTWTRD are input to a NAND gate 41D. An output from the NAND gate 41D is input to the NOR gate 41F via an inverter circuit 41E. The signal EXTACTP is input to the NOR gate 41F. An output from the NOR gate 41F is input to an inverter circuit 41G, which outputs an enable signal EN_AX.

The signal generation circuit 41 asserts the enable signal EN_AX upon receiving the read/write command or the active command.

A multiplexer 42A receives a signal CAf<6:3> and a signal CAf<9:6> to output either one of these signals. An output from the multiplexer 42A is represented as a signal CAf_NEXT<6:3>. The signal PREACT and the signal EXTACTP are input to the NOR gate 42B. An output from the NOR gate 42 is input to a control terminal of the multiplexer 42A via the inverter circuit 42. The multiplexer 42A selects the signal CAf<6:3> upon receiving the active command and otherwise selects the CAf<9:6>.

The enable signal EN_AX from the signal generation circuit 41 is input to enable terminals of flip flops (latch circuits) 43A to 43C. A signal CAf<7>, a signal CAf_NEXT<6:3>, and a signal CAf<2:0> are input to the flip flop 43A. When the enable signal EN_AX is asserted, the flip flop 43A latches the signal CAf<7>, the signal CAf_NEXT<6:3>, and the signal CAf<2:0> and outputs a latched signal AX<7:0>. A signal CAr<6:2> is input to the flip flop 43B. When the enable signal EN_AX is asserted, the flip flop 43B latches the signal CAr<6:2> and outputs a latched signal AX<12:8>. A signal CAf<8> is input to the flip flop 43C. When the enable signal EN_AX is asserted, the flip flop 43C latches the signal CAf<8> and outputs a latched signal AX<13>.

In the comparative example, as shown in FIG. 6, the read/write command is input one clock cycle (1tCK) after the input of the active command. In the comparative example, a row address R<13:0> (AX<13:0>) needs to be latched within one clock cycle (1tCK). This results in the need for high precision of the internal timing.

Example

Figure 8:
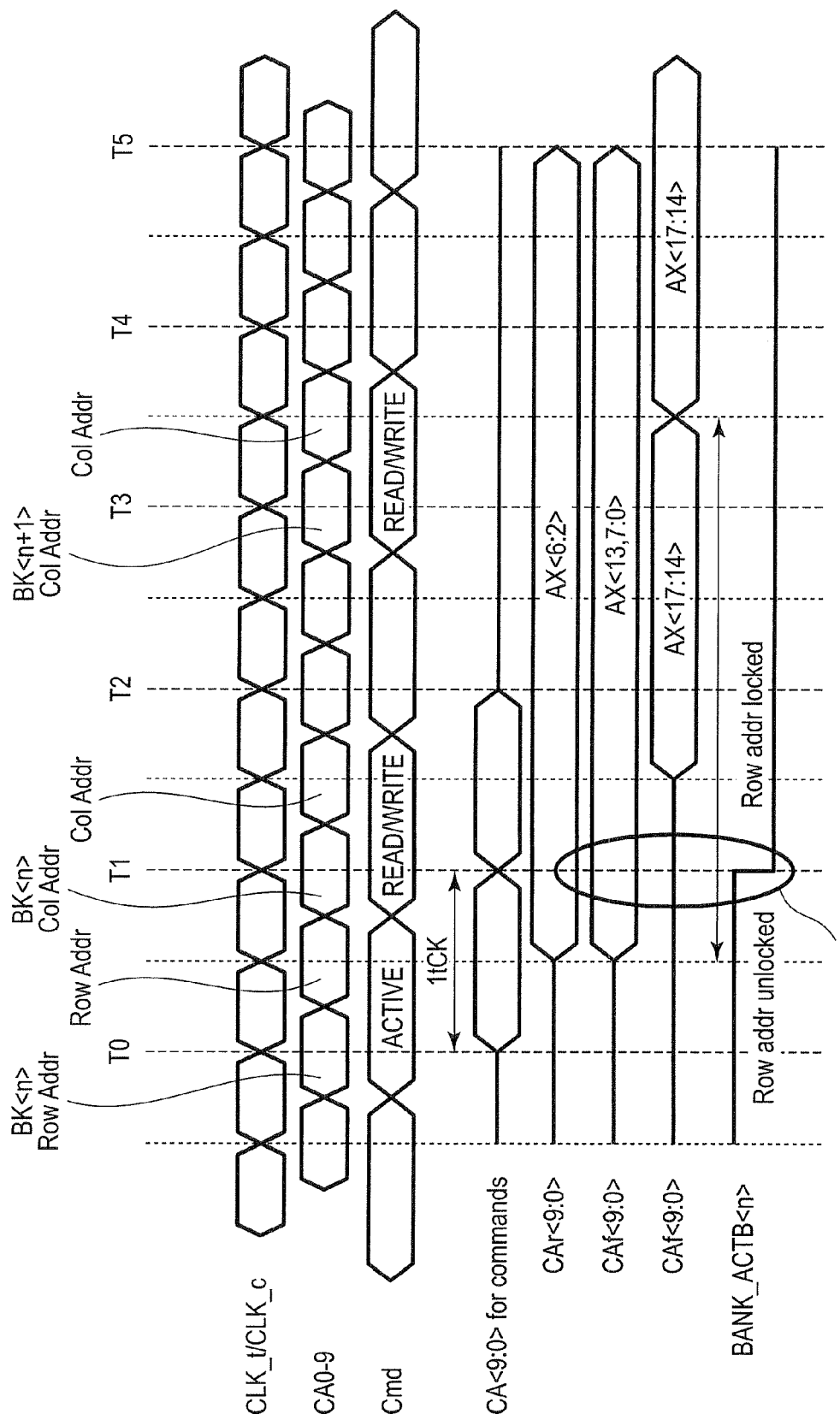
FIG. 8 is a timing chart according to the first embodiment.
Figure 9:
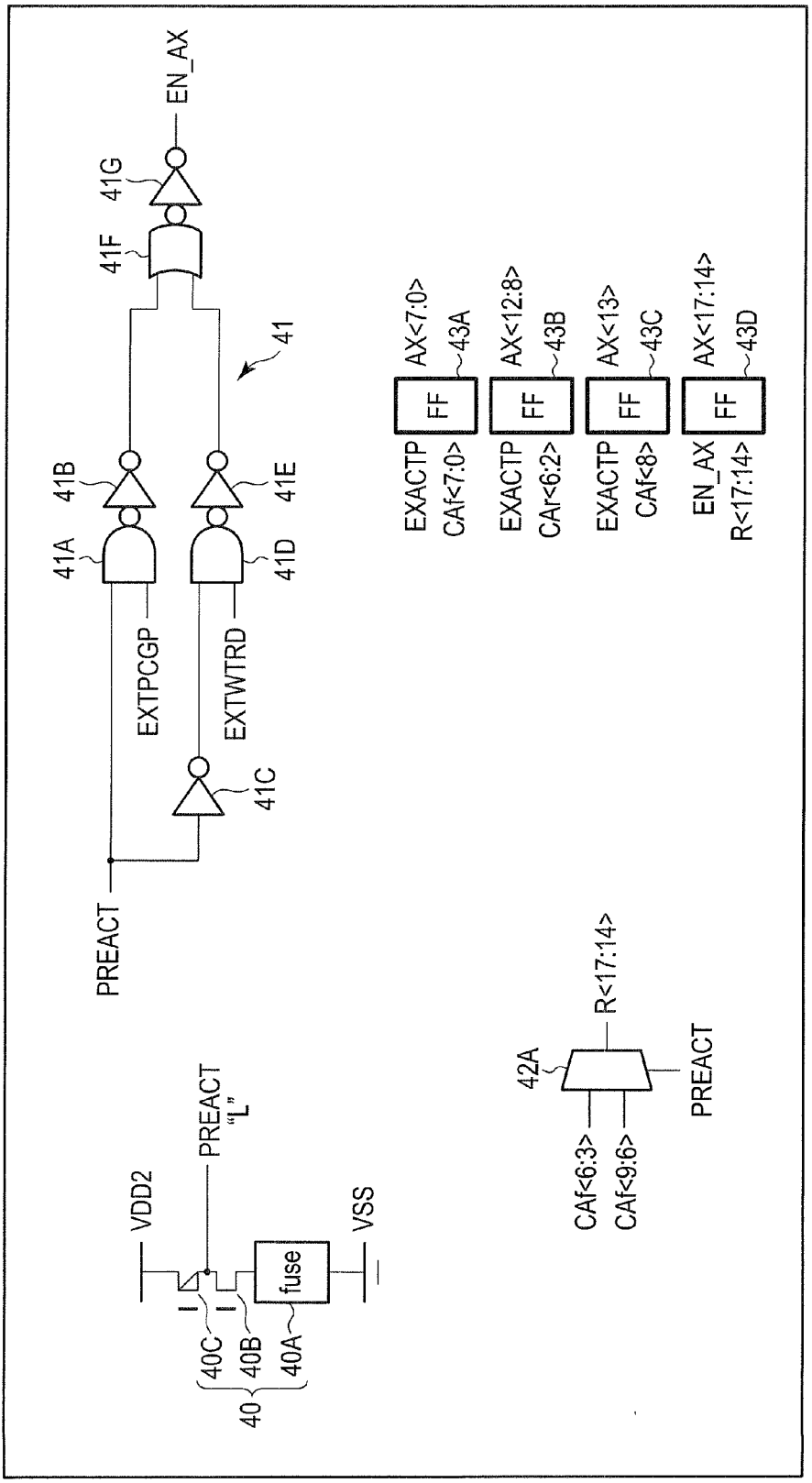
FIG. 9 is a diagram illustrating an operation according to the first embodiment.

Now, an example will be described. FIG. 8 is a timing chart according to the example. FIG. 9 is a diagram illustrating an operation according to the example.

The signal PREACT is input to a control terminal of the multiplexer 42A, which outputs a row address R<17:14>.

In the signal generation circuit 41, an output from the inverter circuit 41B and an output from the inverter circuit 41E are input to the NOR gate 41F. The signal generation circuit 41 asserts the enable signal EN_AX upon receiving the read/write command.

The signal EXTACTP is input to the enable terminals of the flip flops 43A to 43C. The signal CAf<7:0> is input to the flip flop 43A. When the signal EXTACTP is asserted, the flip flop 43A latches the signal CAf<7:0> and outputs the latched signal AX<7:0>. The signal CAr<6:2> is input to the flip flop 43B. When the signal EXTACTP is asserted, the flip flop 43B latches the signal CAr<6:2> and outputs the latched signal AX<12:8>. The signal CAf<8> is input to the flip flop 43C. When the signal EXTACTP is asserted, the flip flop 43C latches the signal CAf<8> and outputs the latched signal AX<13>.

The enable signal EN_AX from the signal generation circuit 41 is input to the enable terminal of a flip flop (latch circuit) 43D. The row address R<17:14> is input to the flip flop 43D. When the enable signal EN_AX is asserted, the flip flop 43D latches the row address R<17:14> and outputs a latched signal AX<17:14>.

In FIG. 7, the setting circuit 40 and the signal generation circuit 41 are, for example, included in the control circuit 25 shown in FIG. 2. The multiplexer 42A and the flip flops 43A to 43D are, for example, included in the address latch circuit 26 shown in FIG. 2.

The example includes the additional flip flop 43D, which performs a latch operation independently of the active command and based on the read/write command. That is, a path for the row address R<13:0> (AX<13:0>) set by the active operation is separate from a path for the row address R<17:14> (AX<17:14>) set by the postactive operation. Hence, in the embodiment, the row address AX<13:0> may be latched within three clock cycles (3tCK) as shown in FIG. 8. That is, in the example, the row address AX<13:0> may be latched within a delay time tRRD (=RAS–RAS delay time) from the active operation on the bank BK<n> until the active operation on the bank BK<n+1>. This enables a reduction in the need for the precision of the internal timing.

Second Embodiment

A second embodiment is an example in which, in a preactive operation, a part of a row address is set inside a semiconductor memory device 10. That is, when an active command is input, a part of the row address is latched in an address latch circuit 26. Another part of the row address is pre-latched in the address latch circuit 26 when a precharge command, which is input before the input of the active command, is input.

<Command/Address Assignment>

Now, command/address assignment will be described. FIG. 10 is a diagram illustrating command/address assignment for the precharge command. FIG. 11 is a diagram illustrating command/address assignment for the active command.

In FIG. 10 and FIG. 11, a row address R comprises, for example, 18 bits (R0 to R17). A first row address (a part of a full row address) included in the bits R0 to R17 of the full row address and input along with the precharge command comprises, for example, upper bits R14 to R17. A second row address (another part of the full row address) included in the bits R0 to R17 of the full row address and input along with the active command comprises, for example, lower bits R0 to R13.

In FIG. 10, when the precharge command is input, a precharge operation is specified at a rising edge of a clock CLK and a preactive operation is specified at a falling edge of the clock CLK. That is, the precharge command can set the precharge operation and the preactive operation. The precharge command is defined using CA0=H, CA1=H, CA2=L, and CA3=H at the rising edge of the clock CLK when a chip select signal CS is asserted.

In the precharge operation, a flag AB specifying whether or not to precharge all banks is received through a pad CA4. A bank addresses BA0 to BA2 is received through pads CA7 to CA9. "X" means don't care.

In the precharge operation, the upper row addresses R14 to R17 is received through pads CA3 to CA6, and the bank addresses BA0 to BA2 is received through the pads CA7 to CA9. According to the second embodiment, the bank addresses BA0 to BA2 can be specified in each of the precharge operation and the preactive operation. Thus, the same precharge command allows the precharge operation and the preactive operation to be performed on different banks.

In FIG. 11, an active operation is specified at the rising edge and falling edge of the clock CLK when the active command is input. The active command is defined using CA0=L and CA1=H at the rising edge of the clock CLK when the chip select signal CS is asserted. Furthermore, at the rising edge of the clock CLK, the row addresses R8 to R12 is received through the pads CA2 to CA6, and the bank addresses BA0 to BA2 is received through the pads CA7 to CA9. At the falling edge of the clock CLK, the row addresses R0 to R13 is received through the pads CA0 to CA8.

Example

Figure 12:
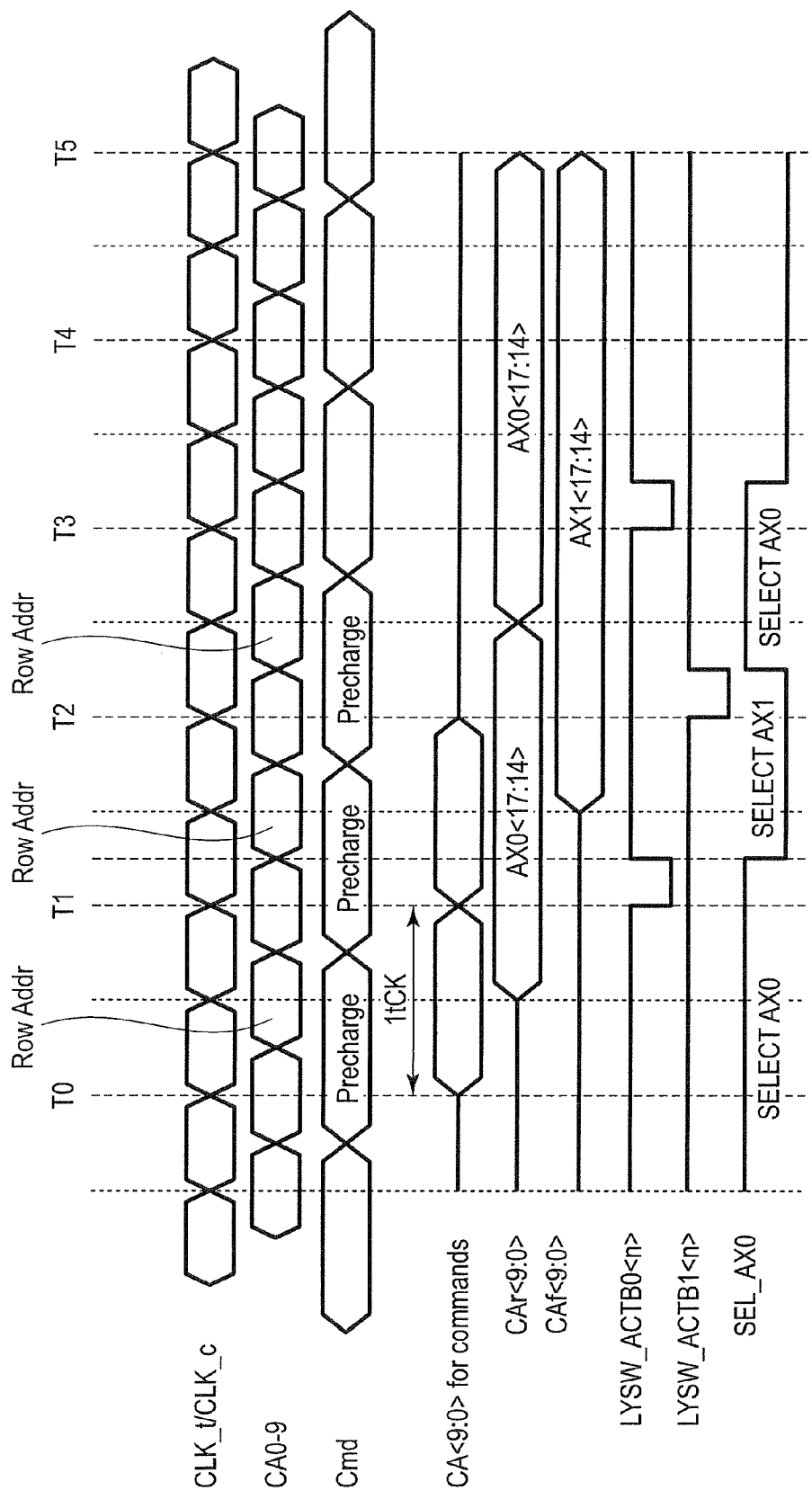
FIG. 12 is a timing chart according to a second embodiment.
Figure 13:
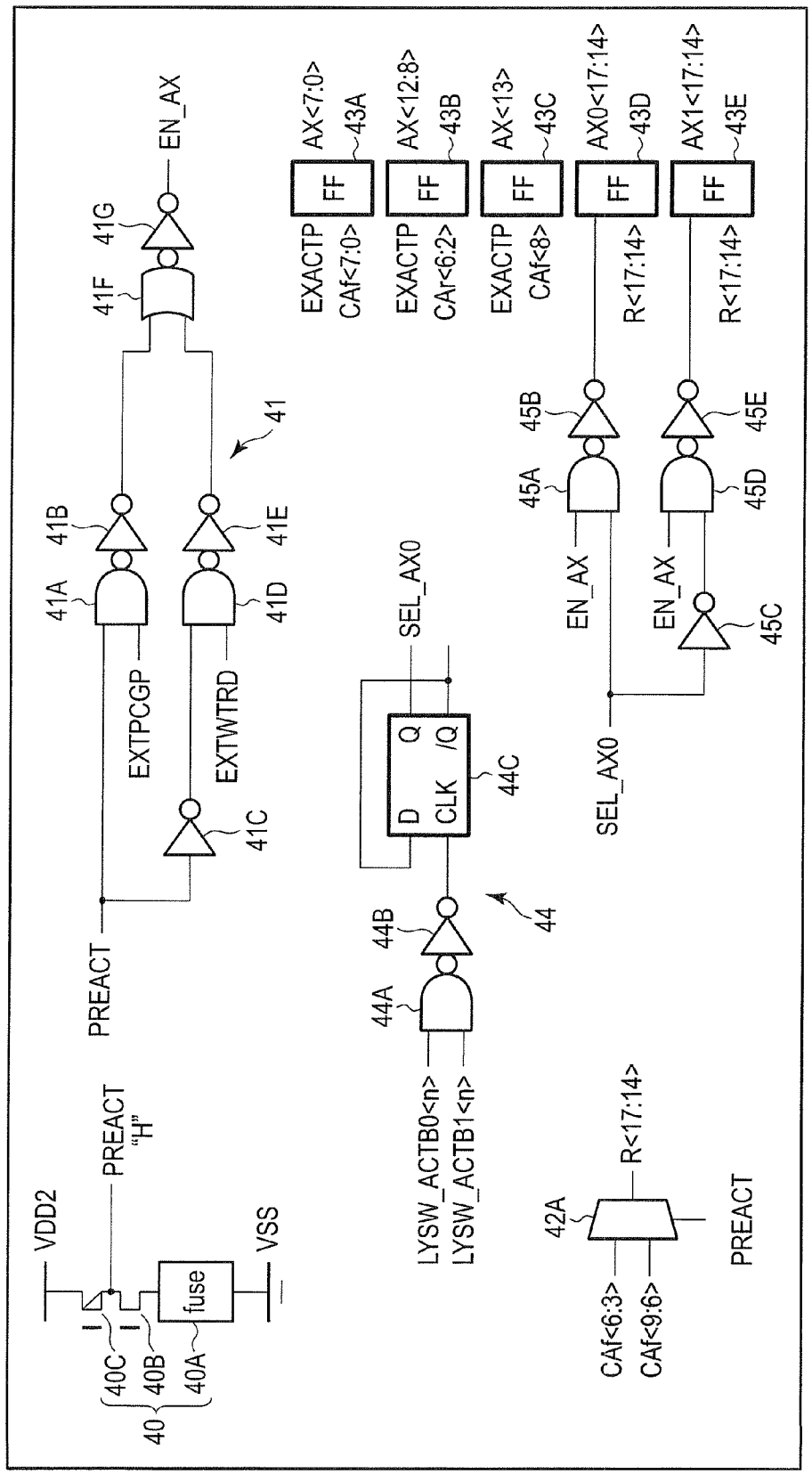
FIG. 13 is a diagram illustrating an operation according to the second embodiment.

FIG. 12 is a timing chart according to an example. FIG. 13 is a diagram illustrating an operation according to the example. In FIG. 13, operations of a multiplexer 42A, a signal generation circuit 41, and flip flops 43A top 43C are the same as the operations in the first embodiment.

A setting circuit 40 outputs a signal PREACT at a low level when the semiconductor memory device 10 is set for a postactive operation. The setting circuit 40 outputs the signal PREACT at a high level when the semiconductor memory device 10 is set for the preactive operation. According to the second embodiment, the signal PREACT=H.

A signal generation circuit 44 receives a signal LYSW_ACTB0<n> and a signal LYSW_ACTB1<n> to generate a signal SEL_AX0 for controlling flip flops described below. The signal LYSW_ACTB0<n> and the signal LYSW_ACTB1<n> are generated using the precharge command and the bank addresses BA0 to BA2. The signal LYSW_ACTB0<n> and the signal LYSW_ACTB1<n> are alternately asserted (set to the low level) each time the precharge command is input. The signal LYSW_ACTB0<n> and the signal LYSW_ACTB1<n> are input to a clock terminal of a latch circuit 44C via a NAND gate 44A and an inverter circuit 44B. An output end/Q of the latch circuit 44C is connected to an input terminal D of the latch circuit 44C. The signal SEL_AX0 is output from an output terminal Q of the latch circuit 44C.

A NAND gate 45A receives the enable signal EN_AX, which is an output from the signal generation circuit 41, and the signal SEL_AX0, which is an output from the signal generation circuit 44. An output from the NAND gate 45A is input to an enable terminal of a flip flop 43D via an inverter circuit 45B. A row address R<17:14> is input to the flip flop 43D. When the signal EN_AX is asserted (set to the high level) and the signal SEL_AX0 is asserted (set to the high level), the flip flop 43D latches the row address R<17:14> and outputs a latched signal AX0<17:14>.

The signal SEL_AX0 is input to an inverter circuit 45C. An output from the inverter circuit 45C and the enable signal EN_AX are input to a NAND gate 45D. An output from the NAND gate 45D is input to an enable terminal of a flip flop 43E via an inverter circuit 45E.

The row address R<17:14> is input to the flip flop 43E. When the signal EN_AX is asserted and the signal SEL_AX0 is negated (set to the low level), the flip flop 43E latches the row address R<17:14> and outputs a latched signal AX1<17:14>.

In FIG. 13, the signal generation circuit 44 is, for example, included in the control circuit 25 shown in FIG. 2. The flip flops 43A to 43E are included in the address latch circuit 26 shown in FIG. 2.

In the example, a path for a row address R<13:0> (AX<13:0>) set by the active command is separate from a path for the row address R<17:14> (AX<17:14>) set by the precharge command. This enables a reduction in the need for the precision of an internal timing for latching the row address R<13:0>.

Furthermore, based on tag information (signal SEL_AX0), the path for the row address R<17:14> is divided into two paths for AX0<17:14> and AX1<17:14>. Thus, even when the precharge command is sequentially input to the same bank at each clock cycle (1tCK), the need for the precision of an internal timing for setting the row address R<17:14> can be reduced.

The MRAM illustrated in the above-described embodiments may be a spin transfer torque magnetoresistive random access memory (STT-MRAM).

Furthermore, the embodiments have been described taking an MRAM using magnetoresistive elements as an example of the semiconductor memory device. However, the present invention is not limited to the MRAM but is applicable to various types of semiconductor memory devices regardless of whether volatile or nonvolatile. Additionally, the present invention is applicable to resistance change memories similar to the MRAM, for example, an ReRAM (Resistive Random Access Memory) and PCRAM (Phase-Change Random Access Memory).

While certain embodiments have been described, these embodiments have been presented by way of example only, and are not intended to limit the scope of the inventions. Indeed, the novel embodiments described herein may be embodied in a variety of other forms; furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
    banks each including a memory cell array;
    word lines connected to rows in each of the banks;
    a first address latch circuit which latches a full row address specifying one of the word lines, the full row address including a first row address and a second row address; and a second address latch circuit which latches a column address specifying one of the columns of the bank,
wherein:
the first address latch circuit receives a first command and a second command and includes a first latch circuit and a second latch circuit,
the first latch circuit latches the first row address in response to the first command,
the second latch circuit latches the second row address in response to the second command,
the first latch circuit and the second latch circuit are separate from each other, and
the second address latch circuit receives the second command and latches the column address in response to the second command.

2. The device of claim 1, wherein paths for the first row address and the second row address are separate from each other.

3. The device of claim 1, further comprising a control circuit which generates an enable signal for the first latch circuit based on the first command and generates an enable signal for the second latch circuit based on the second command.

4. The device of claim 1, further comprising two paths for the first row address.

5. The device of claim 1, further comprising pads used to externally receive the first row address and the second row address and shared by the first row address and the second row address.

6. The device of claim 1, wherein:
the first command is an active command, and
the second command is a read/write command.

7. The device of claim 1, wherein the memory cell array includes a magnetoresistive element.

8. The device of claim 1, wherein the semiconductor memory device is a spin transfer torque magnetoresistive random access memory (STT-MRAM).

9. The device of claim 1, wherein the first address latch circuit receives the second command at a clock next to a clock at which the first address latch circuit receives the first command.

10. The device of claim 1, wherein paths for the first row address and the second row address are separate from a path for a column address.

11. A semiconductor memory device comprising:
banks each including a memory cell array;
word lines connected to rows in each of the banks;
pads which receive a first command and a second command, and receive a full row address specifying one of the word lines, the full row address including a first row address and a second row address;
a control circuit which generates tag information which distinguishes two first commands from each other when the two first commands are consecutively input;
a first latch circuit which latches a first row address corresponding to one of the two first commands based on the tag information in response to the one of the two first commands;
a second latch circuit which latches a first row address corresponding to another of the two first commands based on the tag information in response to the another of the two first commands; and
a third latch circuit which latches the second row address in response to the second command.

12. The device of claim 11, wherein the first latch circuit and the second latch circuit latch first row addresses alternately.

13. The device of claim 11, wherein the control circuit generates a first enable signal for the first latch circuit based on the one of the two first commands, a second enable signal for the second latch circuit based on the another of the two first commands, and a third enable signal for the third latch circuit based on the second command.

14. The device of claim 11, wherein:
the first command is a precharge command, and
the second command is an active command.

15. The device of claim 11, wherein the memory cell array includes a magnetoresistive element.

16. The device of claim 11, wherein the semiconductor memory device is a spin transfer torque magnetoresistive random access memory (STT-MRAM).

* * * * *